United States Patent
Zhao et al.

(10) Patent No.: US 12,159,943 B2
(45) Date of Patent: Dec. 3, 2024

(54) GaN VERTICAL-CHANNEL JUNCTION FIELD-EFFECT TRANSISTORS WITH REGROWN p-GaN BY METAL ORGANIC CHEMICAL VAPOR DEPOSITION (MOCVD)

(71) Applicants: Yuji Zhao, Chandler, AZ (US); Chen Yang, Tempe, AZ (US); Houqiang Fu, Tempe, AZ (US); Xuanqi Huang, Tempe, AZ (US); Kai Fu, Tempe, AZ (US)

(72) Inventors: Yuji Zhao, Chandler, AZ (US); Chen Yang, Tempe, AZ (US); Houqiang Fu, Tempe, AZ (US); Xuanqi Huang, Tempe, AZ (US); Kai Fu, Tempe, AZ (US)

(73) Assignee: Arizona Board of Regents on behalf of Arizona State University, Scottsdale, AZ (US)

( * ) Notice: Subject to any disclaimer, the term of this patent is extended or adjusted under 35 U.S.C. 154(b) by 20 days.

(21) Appl. No.: 17/981,178

(22) Filed: Nov. 4, 2022

(65) Prior Publication Data
US 2023/0106300 A1 Apr. 6, 2023

Related U.S. Application Data

(62) Division of application No. 17/372,810, filed on Jul. 12, 2021, now Pat. No. 11,495,694.
(Continued)

(51) Int. Cl.
*H01L 29/808* (2006.01)
*H01L 21/3065* (2006.01)
(Continued)

(52) U.S. Cl.
CPC ...... *H01L 29/8083* (2013.01); *H01L 21/3065* (2013.01); *H01L 21/3081* (2013.01);
(Continued)

(58) Field of Classification Search
None
See application file for complete search history.

(56) References Cited

U.S. PATENT DOCUMENTS 10,964,749 B2   3/2021   Fu et al.
11,495,694 B2   11/2022  Zhao et al.
(Continued)

FOREIGN PATENT DOCUMENTS

CN   111341850 A   *   6/2020

OTHER PUBLICATIONS

A Reverse Conducting GaN Vertical Junction Field Effect Transistor. (Year: 2020).*
(Continued)

*Primary Examiner* — Khaja Ahmad
(74) *Attorney, Agent, or Firm* — Fish & Richardson P.C.

(57) ABSTRACT

Fabricating a vertical-channel junction field-effect transistor includes forming an unintentionally doped GaN layer on a bulk GaN layer by metalorganic chemical vapor deposition, forming a Cr/SiO$_2$ hard mask on the unintentionally doped GaN layer, patterning a fin by electron beam lithography, defining the Cr and SiO$_2$ hard masks by reactive ion etching, improving a regrowth surface with inductively coupled plasma etching, removing hard mask residuals, regrowing a p-GaN layer, selectively etching the p-GaN layer, forming gate electrodes by electron beam evaporation, and forming source and drain electrodes by electron beam evaporation. The resulting vertical-channel junction field-effect transistor includes a doped GaN layer, an unintentionally doped GaN layer on the doped GaN layer, and a p-GaN regrowth layer
(Continued)

15 Claims, 12 Drawing Sheets

Related U.S. Application Data

(60) Provisional application No. 63/050,505, filed on Jul. 10, 2020.

(51) Int. Cl.
  *H01L 21/308* (2006.01)
  *H01L 29/10* (2006.01)
  *H01L 29/20* (2006.01)
  *H01L 29/66* (2006.01)

(52) U.S. Cl.
  CPC ...... *H01L 29/1058* (2013.01); *H01L 29/2003* (2013.01); *H01L 29/66446* (2013.01); *H01L 29/66909* (2013.01)

(56) References Cited

U.S. PATENT DOCUMENTS

| | | | |
|---|---|---|---|
| 11,527,573 B2 | 12/2022 | Fu et al. | |
| 2007/0096145 A1* | 5/2007 | Watanabe | H01L 29/8083 257/E29.313 |
| 2010/0148224 A1* | 6/2010 | Zhao | H01L 29/8083 257/263 |
| 2013/0032814 A1 | 2/2013 | Bour et al. | |
| 2013/0126888 A1* | 5/2013 | Kizilyalli | H01L 21/2654 438/534 |
| 2013/0292686 A1* | 11/2013 | Kizilyalli | H01L 29/7832 438/192 |
| 2014/0312355 A1 | 10/2014 | Kizilyalli et al. | |
| 2015/0137137 A1 | 5/2015 | Chowdhury et al. | |
| 2015/0255582 A1* | 9/2015 | Romano | H01L 29/205 438/192 |
| 2018/0182882 A1 | 6/2018 | Hashimoto et al. | |
| 2018/0190789 A1* | 7/2018 | Bour | H01L 29/66462 |
| 2018/0219072 A1* | 8/2018 | Ye | H01L 29/8083 |
| 2019/0115448 A1 | 4/2019 | Chowdhury et al. | |
| 2020/0144328 A1 | 5/2020 | Fu et al. | |
| 2020/0273965 A1 | 8/2020 | Kizilyalli et al. | |
| 2021/0104603 A1 | 4/2021 | Zhao et al. | |
| 2021/0242281 A1 | 8/2021 | Fu et al. | |
| 2021/0399125 A1 | 12/2021 | Huang et al. | |
| 2022/0013671 A1 | 1/2022 | Zhao et al. | |

OTHER PUBLICATIONS

Alugubelli et al., "Determination of electronic band structure by electron holography of etched-and-regrown interfaces in GaN p-i-n diodes," Appl. Phys. Lett., 115(20):201602, Nov. 2019, 6 pages.

Amano et al., "The 2018 GaN power electronics roadmap," J. Phys. D. Appl. Phys., 51(16):163001, 2018, 49 pages.

Aragon et al., "Interfacial Impurities and Their Electronic Signatures in High-Voltage Regrown Nonpolar m-Plane GaN Vertical p-n Diodes," Phys. Status Solidi, 217:1900757, Dec. 2019, 7 pages.

Chen et al., "Characterizations of nonlinear optical properties on GaN crystals in polar, nonpolar, and semipolar orientations," Appl. Phys. Lett., 110(18):181110, May 2017, 5 pages.

Cruz et al., "Crystallographic orientation dependence of dopant and impurity incorporation in GaN films grown by metalorganic chemical vapor deposition," J. Cryst. Growth, 311(15):3817-3823, 2009.

Debald et al., "Growth and Characterization of Vertical and Lateral p-n Junctions Formed by Selective-Area p-GaN MOVPE on Patterned Templates," Phys. Status Solidi, 216(2):1800677, Jan. 2019, 8 pages.

Fu et al., "Analysis of low efficiency droop of semipolar InGaN quantum well light-emitting diodes by modified rate equation with weak phase-space filling effect," AIP Adv., 6(6):65013, Jun. 2016, 9 pages.

Fu et al., "Demonstration of 1.27 kV Etch-Then-Regrow GaN p-n Junctions with Low Leakage for GaN Power Electronics," IEEE Electron Device Lett., 40(11):1728-1731, 2019.

Fu et al., "High Voltage Vertical GaN p-n Diodes with Hydrogen-Plasma based Guard Rings," IEEE Electron Device Lett., 41(1):127-130, 2019.

Fu et al., "Investigation of GaN-on-GaN vertical p-n diode with regrown p-GaN by metalorganic chemical vapor deposition," Appl. Phys. Lett., 113(23):233502, Dec. 2018, 5 pages.

Fu et al., "Reverse Leakage Analysis for As-Grown and Regrown Vertical GaN-on-GaN Schottky Barrier Diodes," IEEE J. Electron Devices Soc., 8:74-83, 2020.

Fu et al., "Ultralow turn-on voltage and on-resistance vertical GaN-on-GaN Schottky power diodes with high mobility double drift layers," Appl. Phys. Lett., 111(15):152102, Oct. 2017, 6 pages.

Hu et al., "1.1-kV Vertical GaN p-n Diodes With p-GaN Regrown by Molecular Beam Epitaxy," IEEE Electron Device Lett., 38(8):1071-1074, 2017.

Ji et al., "Design of 1.2 kV Power Switches with Low Ron Using GaN-Based Vertical JFET," IEEE Trans. Electron Devices, 62(8):2571-2578, 2015.

Jones et al., "Review of Commercial GaN Power Devices and GaN-Based Converter Design Challenges," IEEE J. Emerg. Sel. Top. Power Electron., 4(3):707-719, 2016.

Kodama et al., "GaN-Based Trench Gate Metal Oxide Semiconductor Field-Effect Transistor Fabricated with Novel Wet Etching," Appl. Phys. Express, 1:21104, 2008, 3 pages.

Kotzea et al., "Demonstration of a GaN-Based Vertical-Channel JFET Fabricated by Selective-Area Regrowth," IEEE Trans. Electron Devices, 65(12):5329-5336, 2018.

Liu et al., "Non-uniform Mg distribution in GaN epilayers grown on mesa structures for applications in GaN power electronics," Appl. Phys. Lett., 114(8):82102, Feb. 2019, 6 pages.

Monavarian et al., "High-Voltage Regrown Nonpolar m-Plane Vertical p-n Diodes: A Step Toward Future Selective-Area-Doped Power Switches," IEEE Electron Device Lett., 40(3):387-390, 2019.

Narita et al., "P-type doping of GaN (0001) by magnesium ion implantation," Appl. Phys. Express, 10(1):016501, 2017, 5 pages.

Nie et al., "1.5-kV and 2.2-m22.cm2 Vertical GaN Transistors on Bulk-GaN Substrates," IEEE Electron Device Lett., 35(9):939-941, 2014.

Niwa et al., "High carrier activation of Mg ion-implanted GaN by conventional rapid thermal annealing," Appl. Phys. Express, 10(9):091002, 2017, 5 pages.

Oka et al., "1.8 mΩ•cm2 vertical GaN-based trench metal-oxide-semiconductor field-effect transistors on a free-standing GaN substrate for 1.2-kV-class operation," Appl. Phys. Express, 8(5):054101, 2015, 4 pages.

Otake et al., "Vertical GaN-Based Trench Gate Metal Oxide Semiconductor Field-Effect Transistors on GaN Bulk Substrates," Appl. Phys. Express, 1(1):011105, 2008, 4 pages.

Shelton et al., "Selective area growth and characterization of AlGaN/GaN heterojunction bipolar transistors by metalorganic chemical vapor deposition," IEEE Trans. Electron Devices, 48(3):490-494, 2001.

Shi et al., "Realization of p-type gallium nitride by magnesium ion implantation for vertical power devices," Sci. Rep., 9(1):8796, 2019, 9 pages.

Sun et al., "High-Performance GaN Vertical Fin Power Transistors on Bulk GaN Substrates," IEEE Electron Device Lett., 38(4):509-512, 2017.

Tsao et al., "Ultrawide-Bandgap Semiconductors: Research Opportunities and Challenges," Adv. Electron. Mater., 4(1):1600501, Jan. 2018, 49 pages.

Underwood et al., "Selective-area regrowth of GaN field emission tips," Solid. State. Electron., 41(2):243-245, 1997.

Yoshino et al., "Ion implanted GaN MISFETs fabricated in Mg implanted layers activated by conventional rapid thermal annealing," Nucl. Inst. Methods Phys. Res. B, 449:49-53, 2019.

(56) References Cited

OTHER PUBLICATIONS

Zhang et al., "Large-Area 1.2-kV GaN Vertical Power FinFETs with a Record Switching Figure of Merit," IEEE Electron Device Lett., 40(1):75-78, 2019.

Zhang et al., "Trench formation and corner rounding in vertical GaN power devices," Appl. Phys. Lett., 110(19):193506, May 2017, 5 pages.

Zhao et al., "Toward ultimate efficiency: progress and prospects on planar and 3D nanostructured nonpolar and semipolar InGaN light-emitting diodes," Adv. Opt. Photon., 10(1):246-308, Mar. 2018.

* cited by examiner

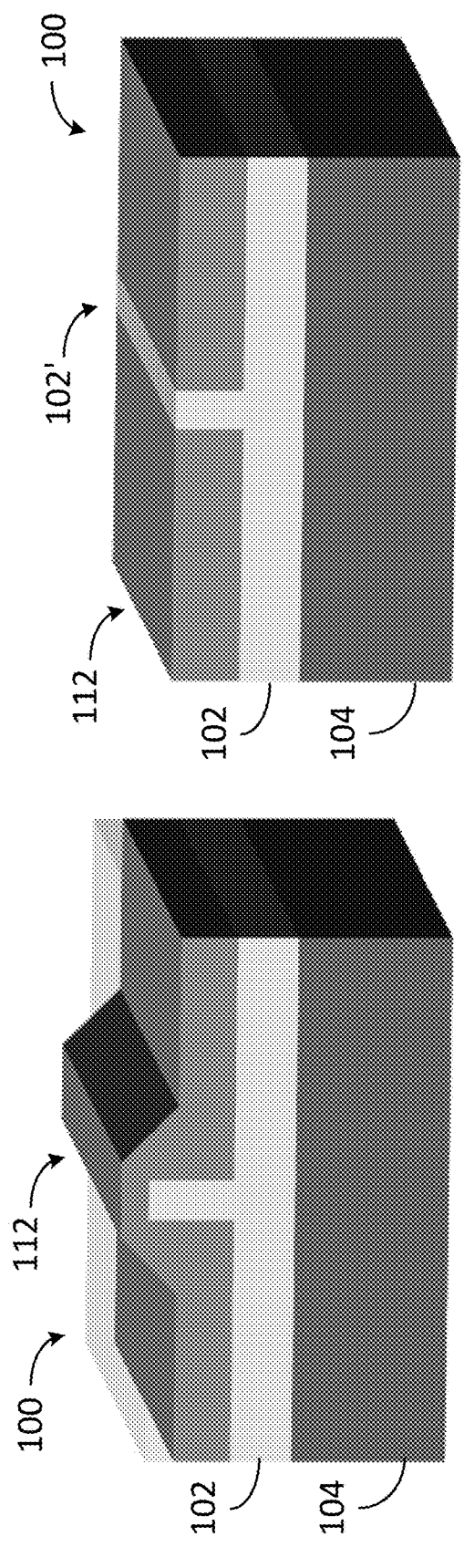
FIG. 1I
FIG. 1J
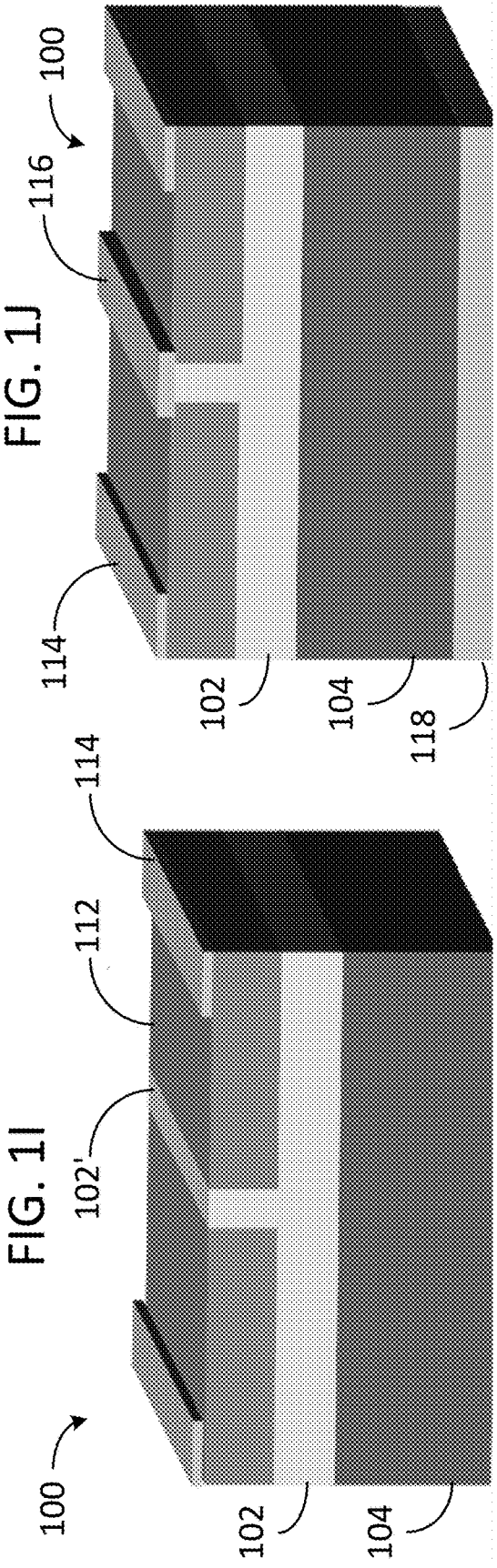
FIG. 1K
FIG. 1L

GaN VERTICAL-CHANNEL JUNCTION FIELD-EFFECT TRANSISTORS WITH REGROWN p-GaN BY METAL ORGANIC CHEMICAL VAPOR DEPOSITION (MOCVD)

CROSS-REFERENCE TO RELATED APPLICATIONS

This application is a divisional of U.S. patent application Ser. No. 17/372,810 filed on Jul. 12, 2021, which claims the benefit of U.S. Patent Application No. 63/050,505 filed on Jul. 10, 2020, which is incorporated herein by reference in its entirety.

STATEMENT OF GOVERNMENT INTEREST

This invention was made with government support under DE-AR0000868 awarded by the Department of Energy. The government has certain rights in the invention.

TECHNICAL FIELD

This invention relates to GaN vertical-channel junction field-effect transistors with regrown p-GaN by metalorganic chemical vapor deposition (MOCVD).

BACKGROUND

GaN-based power electronics have been under extensive research due to GaN's large bandgap, high breakdown electric field (Eb), and large Baliga's figure of merit (BFOM). With the availability of high-quality bulk GaN substrates, GaN vertical devices have become candidates for next-generation power applications, capable of achieving high currents and high breakdown voltage (BV) without enlarging the device area. Researchers have demonstrated the metal-oxide-semiconductor field-effect transistor (MOSFET) and the current aperture vertical electron transistor (CAVET). However, GaN MOSFETs still suffer from a low electron mobility in the p-GaN inversion channel and a large turn-on voltage, and the CAVET devices face some challenges in achieving a normally-off operation mode. The GaN vertical-channel junction field effect transistor (VC-JFET) is an alternative GaN vertical power transistor that can be realized by ion implantation or selective area regrowth (SAR). VC-JFETs rely on lateral p-n junction gates to module the fin channel. The p-n junctions can also be building blocks for more complicated bipolar GaN Fin MOSFETS. However, ion implantation in III-nitride materials, especially for p-type doping, is challenging due at least in part to high annealing temperatures and a low activation rate, and GaN SAR has demonstrated Si diffusion into p-GaN and contamination in MOCVD chamber.

SUMMARY

A GaN-based vertical-channel junction field-effect transistor (VC-JFET) is described. A p-GaN regrowth by metalorganic chemical vapor deposition (MOCVD) and a subsequent self-planarization process are used to fabricate the GaN VC-JFETs. Fin-like channel regions are patterned by electron beam lithography (EBL) and aligned to m-plane or a-plane. The electrical properties of lateral and vertical p-n junctions are characterized to verify the effectiveness of the p-GaN regrowth. Both VC-JFETs with m-plane and a-plane channels show decent gate modulation effects. Factors that may affect the device performance include interfacial impurities and non-uniform acceptor distribution.

Thus, a normally-off VC-JFET has been demonstrated in a process that can also be used to fabricate lateral PN junctions and other GaN devices. Self-planarization is shown to be effective in selective area doping. The resulting GaN JFETs demonstrate transconductance suitable for RF applications. Cleanness is shown to be a factor in high quality p-GaN regrowth on a patterned GaN substrate.

In a first general aspect, fabricating a vertical-channel junction field-effect transistor includes forming an unintentionally doped GaN layer on a bulk GaN layer by metalorganic chemical vapor deposition, forming a $Cr/SiO_2$ hard mask on the unintentionally doped GaN layer, patterning a fin by electron beam lithography, defining the Cr and $SiO_2$ hard masks by reactive ion etching, improving a regrowth surface with inductively coupled plasma etching, removing hard mask residuals, regrowing a p-GaN layer, selectively etching the p-GaN layer, forming gate electrodes by electron beam evaporation, and forming source and drain electrodes by electron beam evaporation.

Implementations of the first general aspect can include one or more of the following features.

In some implementations, unintentionally doped GaN layer is homoepitaxially grown. The bulk GaN layer is doped. The fin is aligned to an a-plane or an m-plane. The hard mask residuals are removed by Cr etchant and hydrofluoric acid.

Some implementations include cleaning after removing the hard mask residuals. Cleaning typically includes dipping in tetramethylammonium hydroxide, immersing in piranha, treating with UV-ozone, performing a buffered oxide etch, treating with hydrochloric acid, or any combination thereof.

In some implementations, regrowing the p-GaN layer includes metalorganic chemical vapor deposition. In one example, the gate electrodes include Pd/Ni/Au. In one example, The source and drain electrodes include Ti/Al/Ni.

In a second general aspect, a vertical-channel junction field-effect transistor includes a doped GaN layer, an unintentionally doped GaN layer on the doped GaN layer, and a p-GaN regrowth layer on the unintentionally doped GaN layer. Portions of the p-GaN regrowth layer are separated by a vertical channel of the unintentionally doped GaN layer.

Implementations of the second general aspect can include one or more of the following features.

The vertical-channel junction field-effect transistor includes gate electrodes on the p-GaN regrowth layer. The gate electrodes are separated by the vertical channel of the unintentionally doped GaN layer. The vertical-channel junction field-effect transistor can include a source electrode on the vertical channel of the unintentionally doped GaN layer and a drain electrode on the doped GaN layer.

In some implementations, a regrowth interface is defined between the p-GaN regrowth layer and the unintentionally doped GaN layer. The vertical channel of the unintentionally doped GaN layer forms a vertical p-n junction at the regrowth interface between a gate electrode and a drain electrode. The vertical-channel junction field-effect transistor defines a lateral p-n junction at the regrowth interface perpendicular to the vertical p-n junction. The lateral p-n junction is between the gate electrode and a source electrode. The vertical channel is rectangular or substantially rectangular in shape. That is, the vertical channel defines 90° angles with respect to the p-GaN regrowth layer.

The details of one or more embodiments of the subject matter of this disclosure are set forth in the accompanying drawings and the description. Other features, aspects, and advantages of the subject matter will become apparent from the description, the drawings, and the claims.

BRIEF DESCRIPTION OF DRAWINGS

FIGS. 1A-1L depict steps in an operation to form a vertical-channel junction field-effect transistor (VC-JFET).

DETAILED DESCRIPTION

Figure 1A:
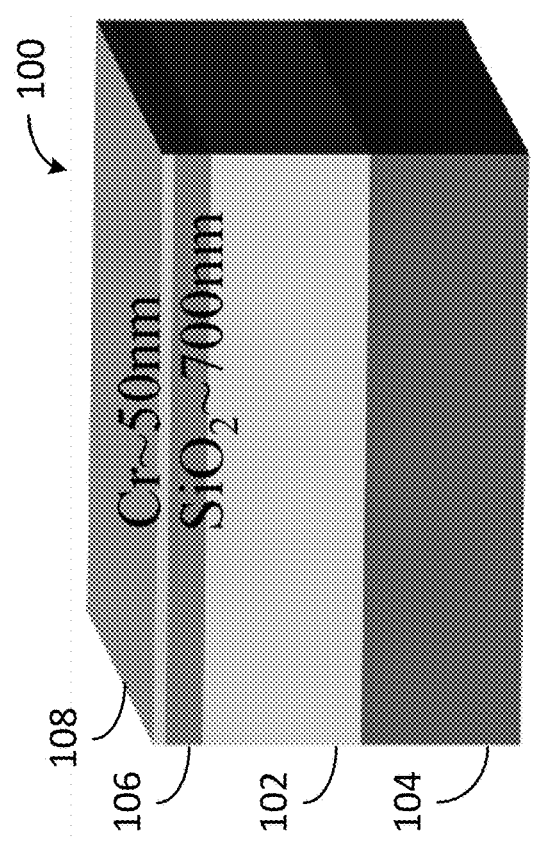
Figure 1B:
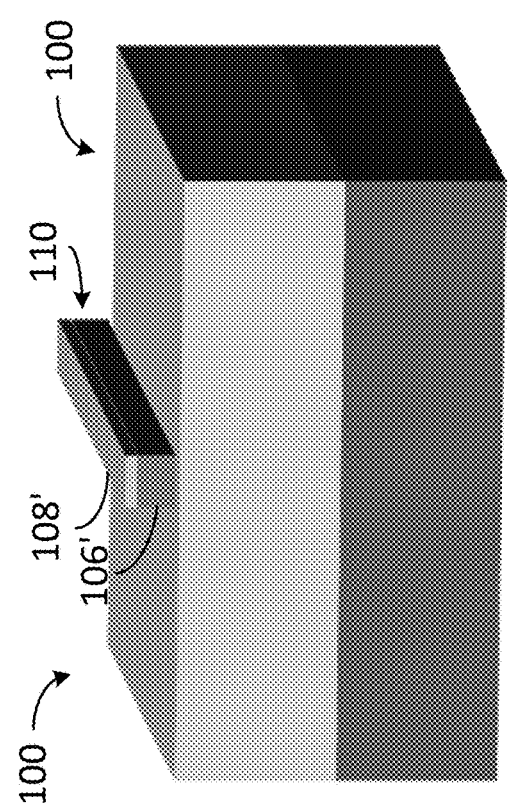
Figure 1C:
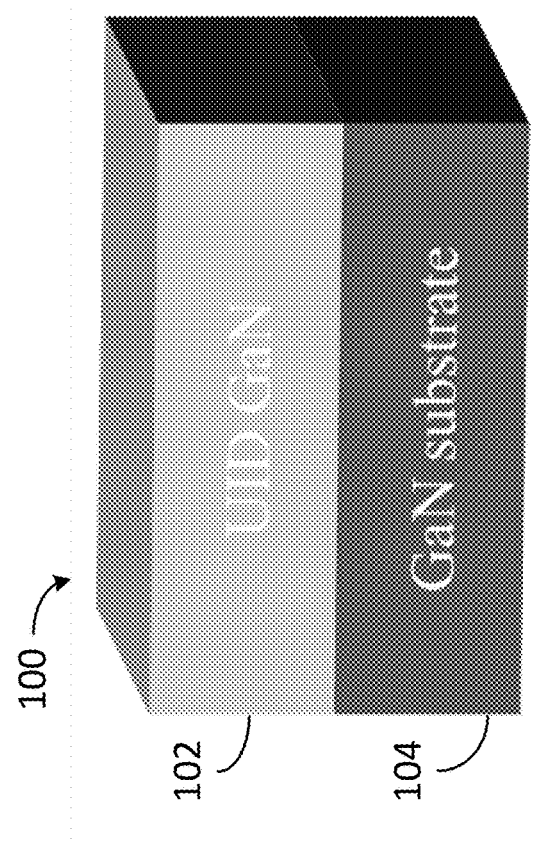
Figure 1D:
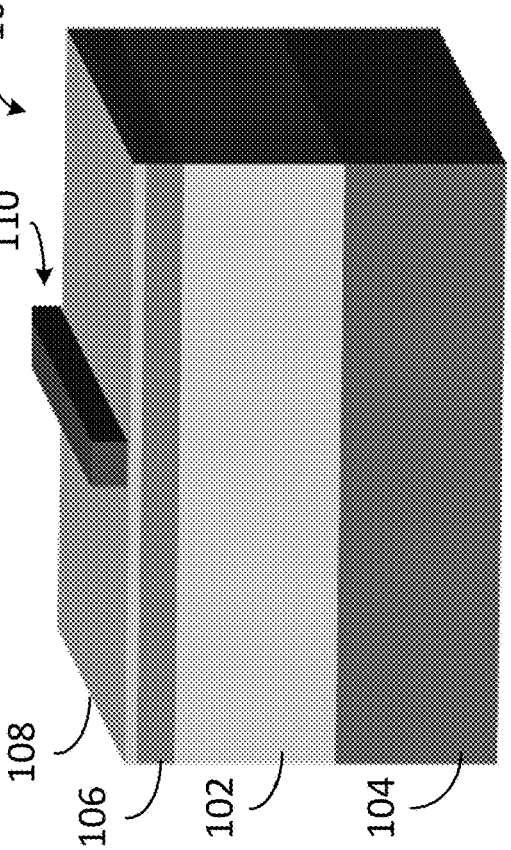
Figure 1E:
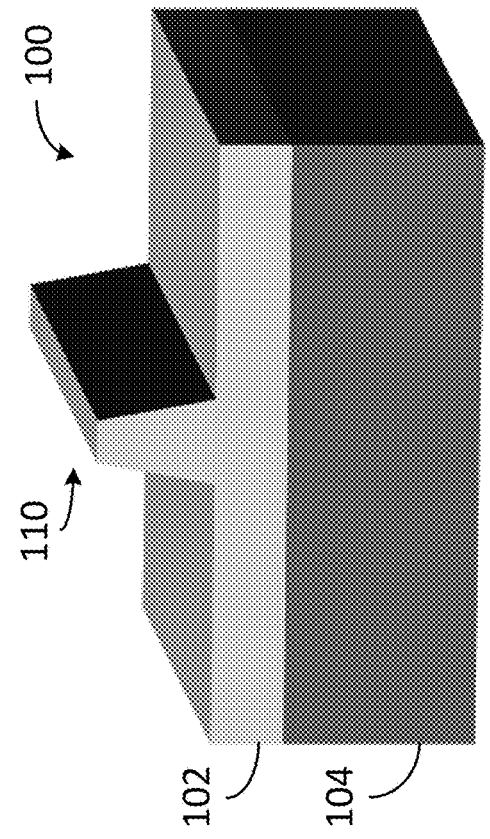
Figure 1F:
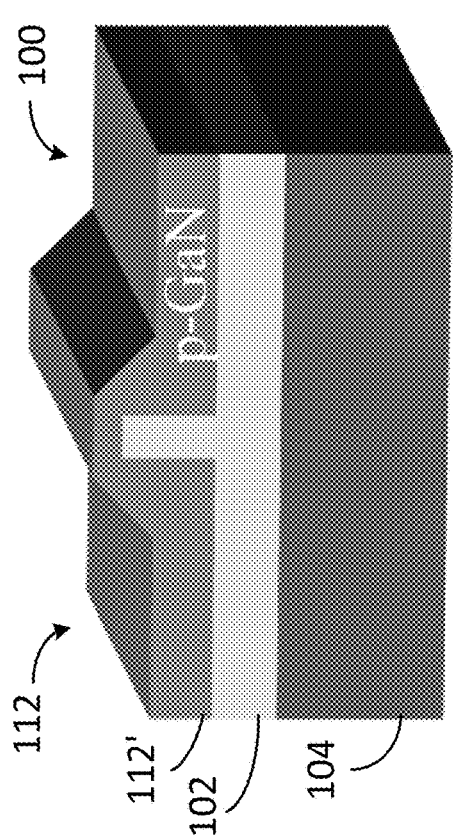
Figure 1G:
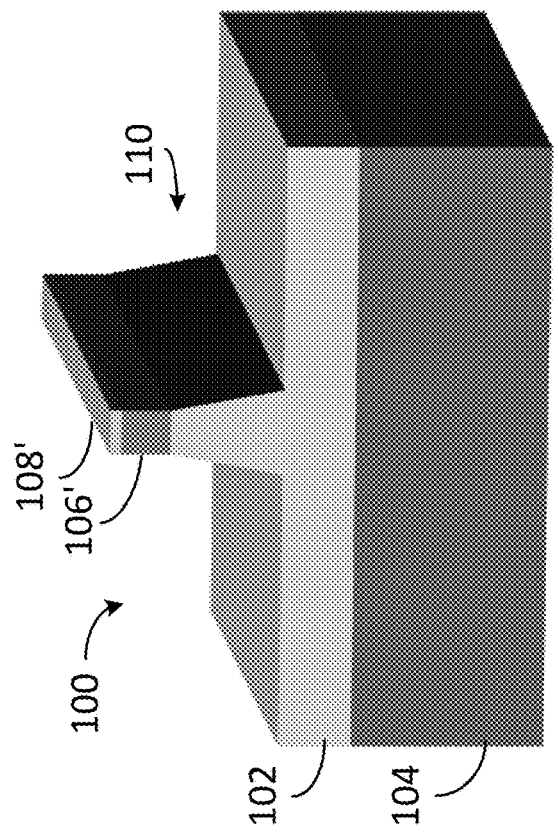
Figure 1H:
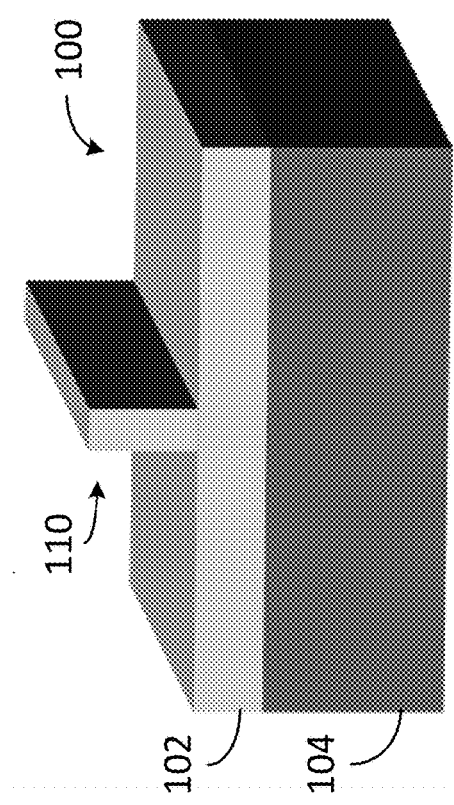

FIGS. 1A-1L depict steps in an operation to form a vertical-channel junction field-effect transistor (VC-JFET) 100. In FIG. 1A, an unintentionally doped (UID) GaN layer 102 is homoepitaxially grown on a heavily doped bulk GaN substrate 104 by a metalorganic chemical vapor deposition (MOCVD) process. In FIG. 1B, a Cr/SiO$_2$ hard mask is formed on the UID GaN layer 102. In one example, SiO$_2$ layer 106 has a thickness of about 700 nm and Cr layer 108 has a thickness of about 50 nm. In FIG. 1C, fins 110 are patterned by electron beam lithography and aligned to either a-plane or m-plane. In FIG. 1D, reactive ion etching (ME) is used to define the Cr and SiO$_2$ hard masks 106', 108'. To improve the regrowth surface, the fins 110 are formed by inductively coupled plasma (ICP) etching as shown in FIG. 1E. In FIG. 1F, the hard mask residuals 106', 108' are removed by Cr etchant and hydrofluoric acid (HF). The sample is cleaned by a variety of processes (e.g., dipping in tetramethylammonium hydroxide (TMAH), immersing in piranha, treating with UV-ozone, performing a buffered oxide etch (BOE) and hydrochloric (HCl) acid for 5 minutes. The cleaned sample depicted in FIG. 1G is re-loaded into a MOCVD chamber for p-GaN regrowth to yield the structure depicted in FIG. 1H with regrowth interface 112'. A photoresist planarization process is conducted to selectively etch away the p-GaN on top of the fin as depicted in FIG. 1I. Top p-GaN etching is performed to expose the n-GaN 102' for source electrodes, as depicted in FIG. 1J. In FIG. 1K, the gate electrodes 114 were formed by electron beam evaporation. FIG. 1L depicts the source and drain electrodes 116, 118 deposited by electron beam evaporation.

EXAMPLES

Device epilayers were grown by MOCVD where trimethylgallium (TMGa) served as the Ga precursor and ammonia (NH$_3$) was the source for nitrogen. The carrier gas was hydrogen (H$_2$). A 4-μm-thick unintentionally doped (UID) GaN was homoepitaxially grown on heavily doped bulk GaN substrates by metalorganic chemical vapor deposition (MOCVD). Device fabrication started with the deposition of Cr (50 nm)/SiO$_2$ (700 nm) hard mask. The fins were patterned by electron beam lithography and aligned to either a plane or m plane. A chlorine (Cl$_2$) and a fluorine (F$_2$) based reactive ion etching (RIE) were used to define the Cr and SiO$_2$ hard masks, respectively. To improve the regrowth surface, the fins were formed by a two-step inductively coupled plasma (ICP) etching: a six-minute fast etching (~280 nm/min), and a three-minute slow etching (~20 nm/min). The hard mask residuals (Cr and SiO$_2$) were removed by Cr etchant and hydrofluoric acid (HF). The sample was then dipped in 75° C. 25% hot tetramethylammonium hydroxide (TMAH) for 5 minutes to further recover etching damages created by ion bombardments during ICP etching. The samples were then immersed in piranha for 15 minutes to further remove possible organic contaminants. The samples were then treated by UV-ozone for 1 hour, followed by buffered oxide etch (BOE) and 10% hydrochloric (HCl) acid for 5 minutes, respectively, to remove surface charges. The cleaned samples were re-loaded into MOCVD chamber for p-GaN regrowth. 1 μm p-GaN (10E17 cm$^{-3}$) was successively grown on the sample with bis(cyclopentadienyl)magnesium (Cp$_2$Mg) as the Mg precursor. After the regrowth, the activation of the regrown p-GaN was conducted at 700° C. for 20 minutes. A photoresist planarization process was used to selectively etch away the p-GaN on top of the fin and expose the n-GaN for source contacts. The gate electrodes were formed by Pd/Ni/Au (30/20/100 nm) by electron beam evaporation and annealed in 450° C. for 5 minutes. The source and drain electrode Ti/Al/Ni (30/100/30 nm) were deposited by the electron beam evaporation.

Figure 2A:
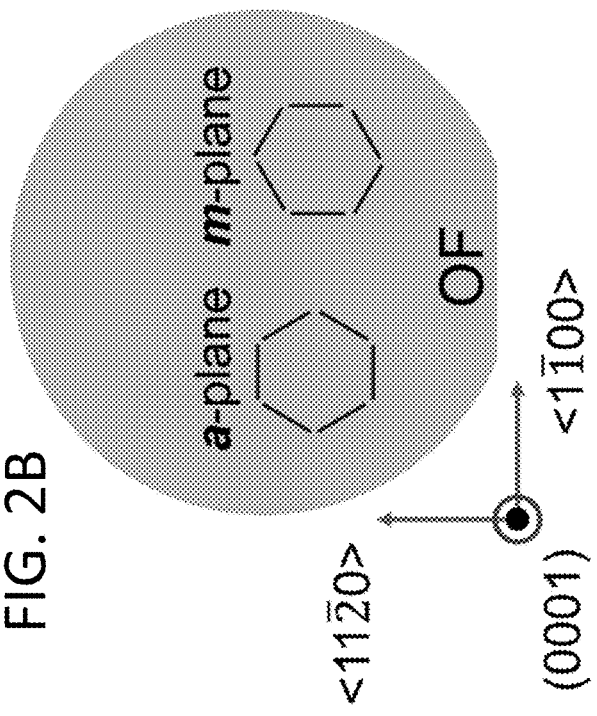
FIGS. 2A and 2B show crystal planes in GaN wurtzite structure and schematics of the fin alignment direction, respectively.
Figure 2B:
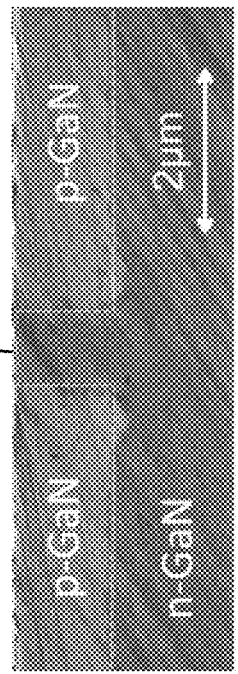
Figure 2C:
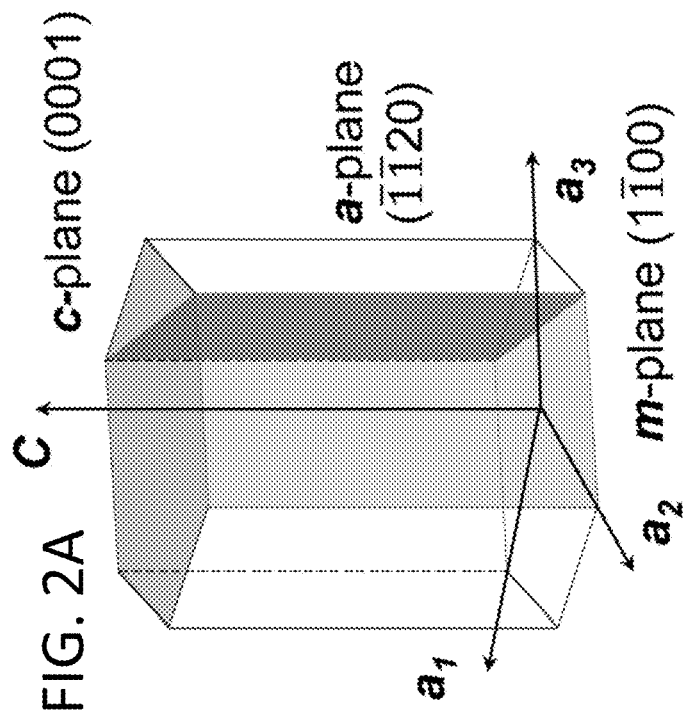
FIGS. 2C and 2D show SEM cross-sectional images of the VC-JFETs in m-plane and a-plane, respectively.
Figure 2D:
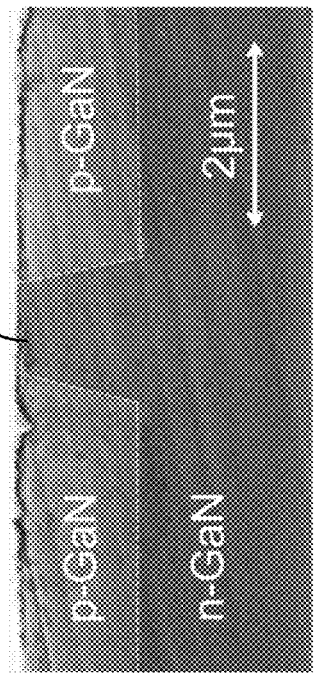

The VC-JFET devices with fins aligned to either a-plane or m-plane were fabricated. FIG. 2A shows the schematic of the GaN crystal planes. The alignment direction relative to orientation flat (OF) is shown in FIG. 2B. The wet etching of TMAH in GaN is strongly anisotropic, which results in different sidewall profiles for the two different crystal orientation. The device aligned to m-plane in FIG. 2D shows a narrower and more vertical fin 110 than that the device aligned to a-plane in FIG. 2C.

Figure 3:
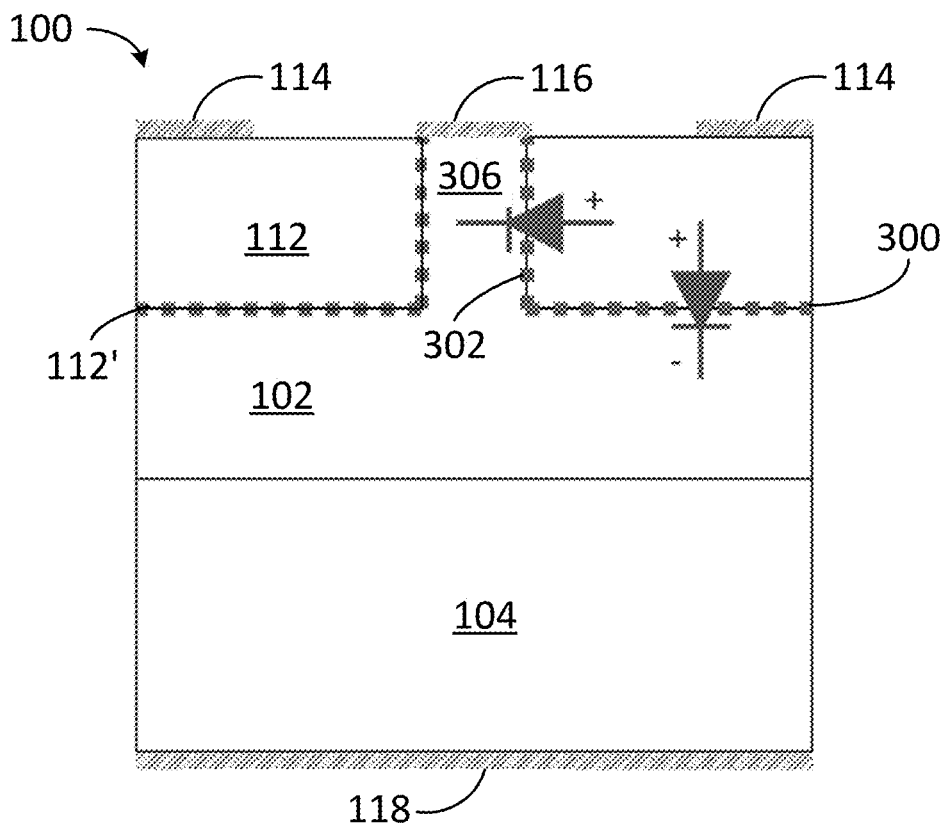
FIG. 3 is a schematic of a cross section of a GaN VC-JFET.

In the GaN VC-JFETs 100, two types of p-n junctions were formed by the p-GaN regrowth: the lateral p-n junction 300 and the vertical p-n junction 302 at regrowth interface 304, as shown in FIG. 3. The lateral p-n junction was between the gate electrode and the source electrode, and the vertical p-n junction was between the gate electrode and the drain electrode. The vertical channel 306 is rectangular in shape, and defines 90° angles with respect to the p-GaN regrowth layer 112.

Figure 4A:
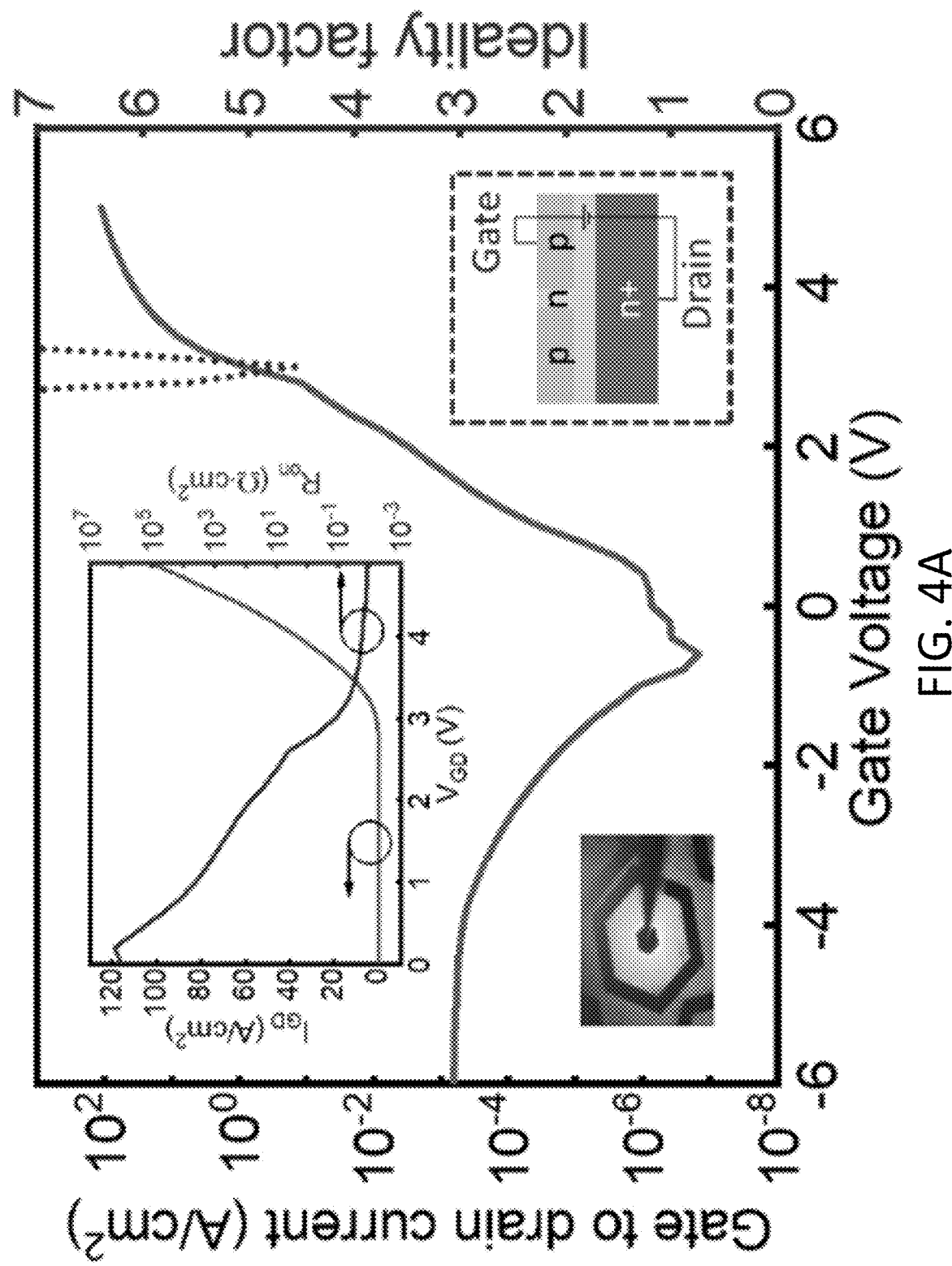
FIG. 4A shows I-V curves for vertical p-n junctions between the gate and the drain.
Figure 4B:
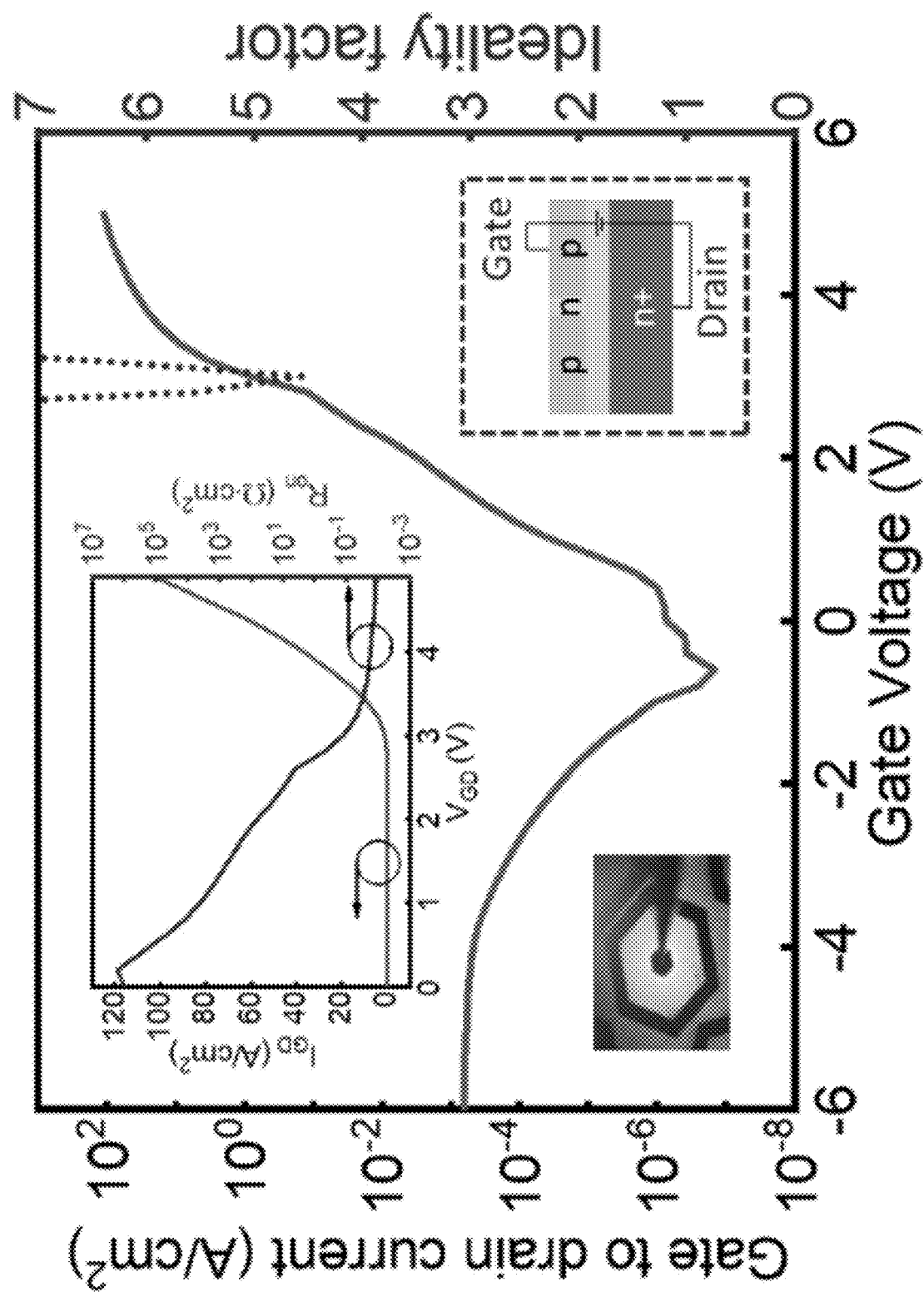
FIG. 4B shows I-V curves for the lateral p-n junctions between the gate and the source. The insets show schematics of the p-n junctions in GaN VC-JFETs.

The current-voltage (I-V) characteristics of the two junctions were measured by a Keithley 2410 source meter. FIGS. 4A and 4B show the representative I-V curves of the vertical and lateral p-n junctions. The currents were normalized by the effective gate region. Similar forward rectifying characteristics with an on/off ratio of ~10$^5$ were observed for both junctions. At forward bias, strong electroluminescence (EL)

was observed, which showed the p-GaN regrowth was effective. The turn-on voltages, as extracted from linear extrapolation were 3.4 V and 3.1 V in the vertical and lateral p-n junctions, respectively. This larger turn-on voltage of the vertical p-n junction is likely due to thicker n-GaN layer in the vertical direction. The two junctions showed abnormal ideality factors of over 4. This is likely caused by the regrowth process where defects, etching damages and impurities can serve as non-radiative recombination centers at the regrowth interfaces. The lateral and vertical p-n junctions show similar leakage currents.

Figure 4C:
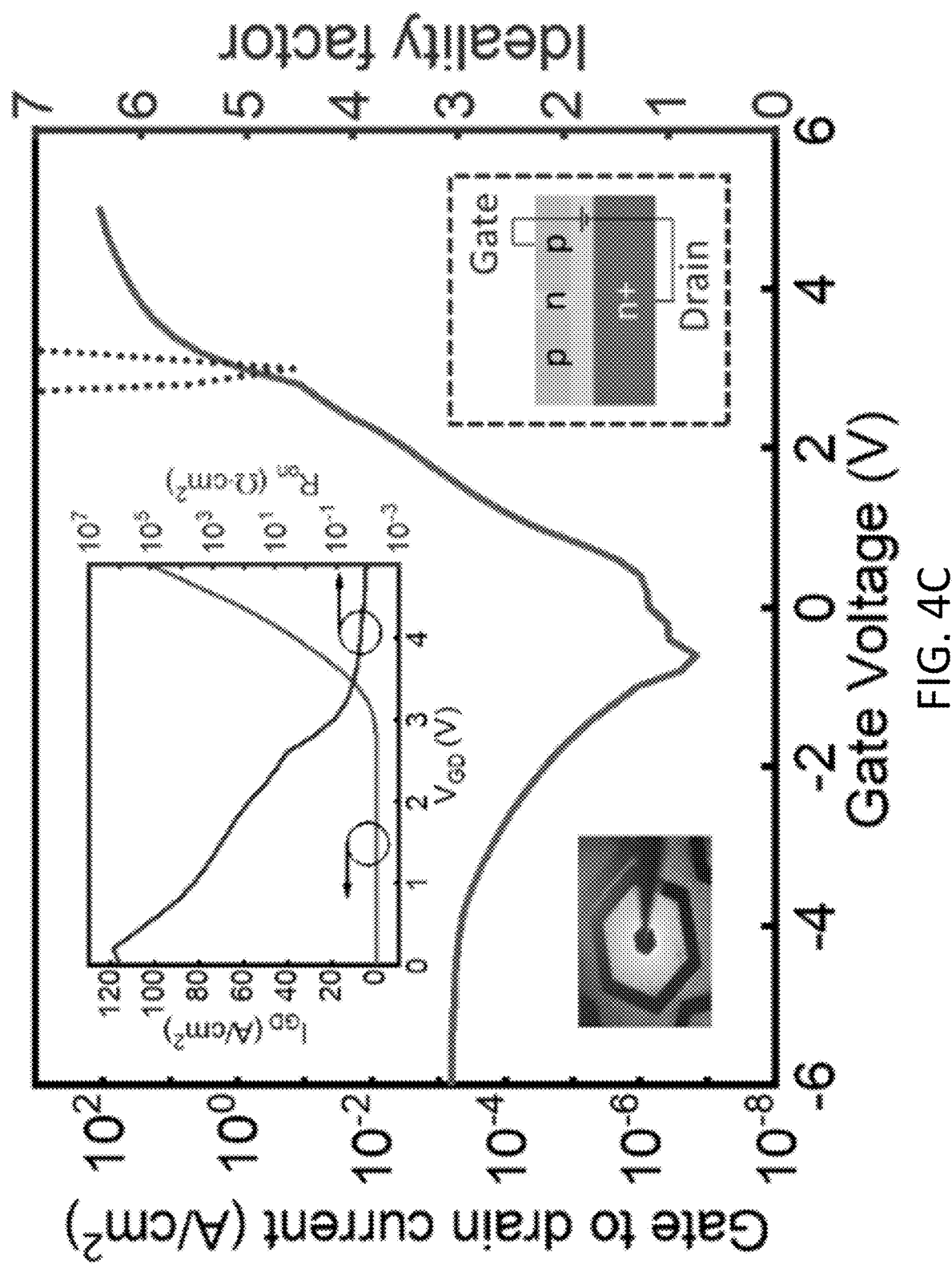
FIG. 4C shows reverse leakage current of a planar diode and a p-n junction between the gate and the drain.

To understand leakage paths for the regrown p-n junctions, the reverse leakage characteristics of a planar diode (without fins) and a vertical p-n junction between the gate and the drain (with fins) on the same wafer are compared in FIG. 4C. Both p-n diodes show larger leakage currents compared with as-grown diodes. The discrepancy between the two diodes become larger with higher reverse bias. This suggests that both non-polar and polar regrowth interfaces contribute to the leakage current. The total leakage is the superposition of leakage currents from all etched surfaces. The c-plane interface may be dominate at low bias (<2 V), and the leakage current through non-polar planes increases with increasing reverse bias. The leakage currents continue to increase after 10 V with no signs of saturation.

Figure 5A:
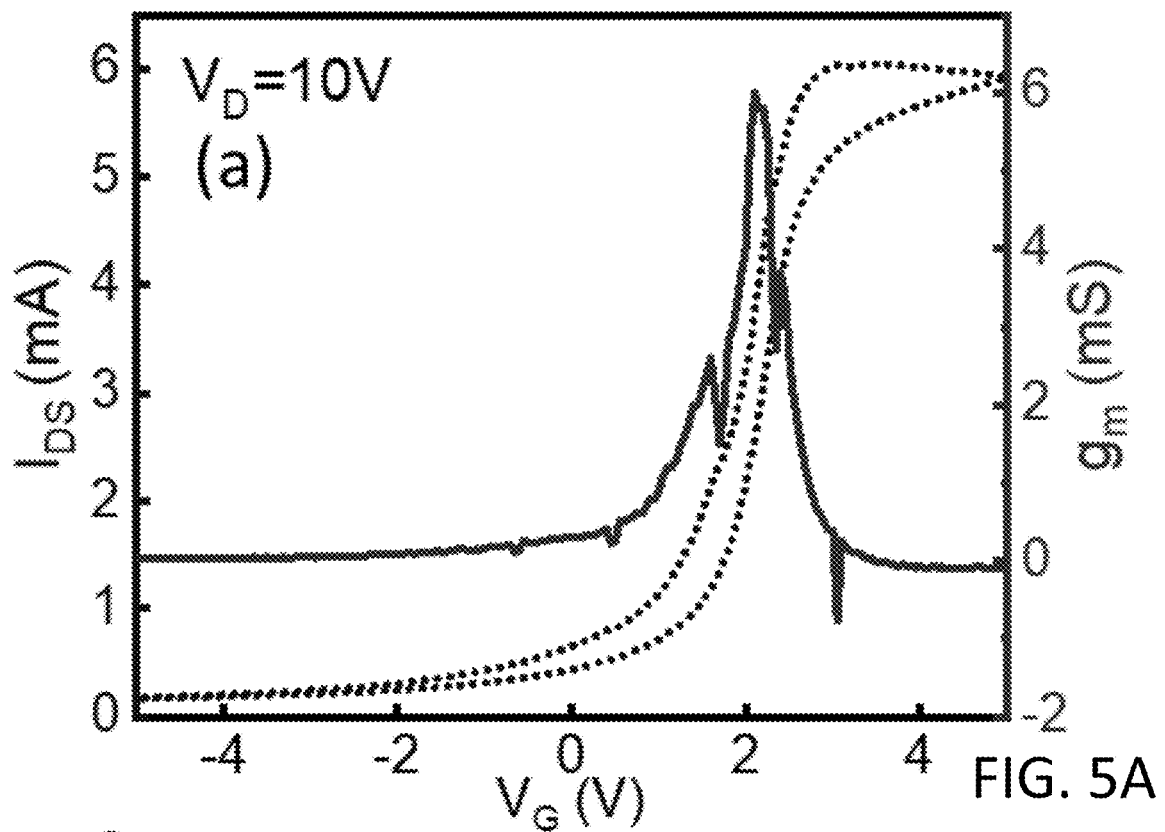
FIG. 5A shows representative $I_D$, $I_G$-$V_{GS}$ transfer characteristics in linear scale.

The transistor characteristics were measured by a Keithley 4200 SCS parameter analyzer. The effective area for the source region is 960 μm$^2$ consisting of six fins each with an area of 1 μm×160 μm. The total device area, including the source/gate electrode areas, is ~2.5×10$^5$ μm$^2$. FIG. 5A shows the transfer characteristics of the VC-JFET with fins aligned to m-plane. The threshold voltage ($V_{th}$) determined by linear extrapolation of the drain current is ~1.4 V. At a drain voltage of 10 V, the on/off ratio is ~100. As the gate voltage increased to 2.2 V, the gate current began to increase due to the turn-on of the gate to source p-n junction, and as a result, the drain current slightly decreased. A hysteresis of ~0.4V was observed in the $I_G$-$V_{GS}$ transfer curve due to charges at the regrowth interface.

Figure 5B:
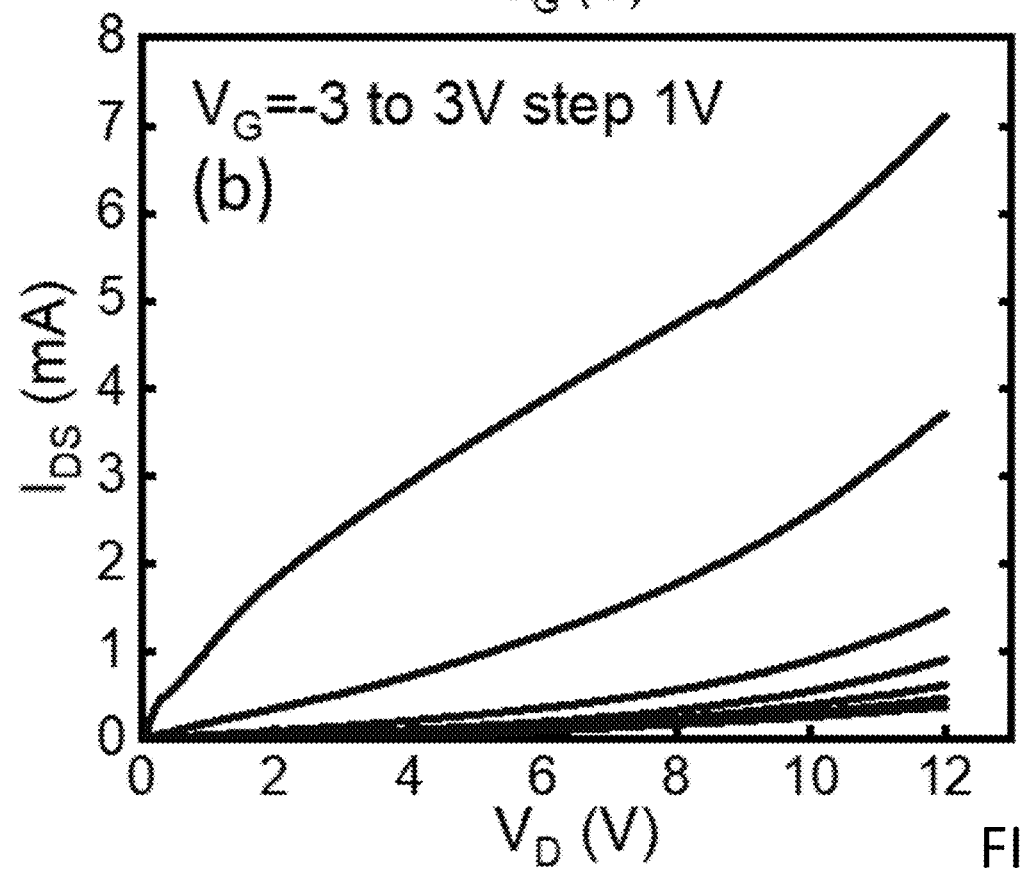
FIG. 5B shows representative $I_D$-$V_{Ds}$ output characteristics.

FIG. 5B shows the output $I_D$-$V_{DS}$ family curves. Gate modulation was obtained, but no current saturation was observed in the VC-JFET mainly due to the gate leakage. The drain current density reached 740 A/cm$^2$ with an $R_{on,sp}$ of 10.5 mΩ·cm$^2$ (normalized by the fin area) at a $V_G$ bias of 3 V and $V_{DS}$ bias of 12 V. The on-resistance normalized by the total device region is 2.8 Ω·cm$^2$. Since non-alloyed contacts for the source and the drain were used, thermal annealing may further decrease the on-resistance.

Figure 6:
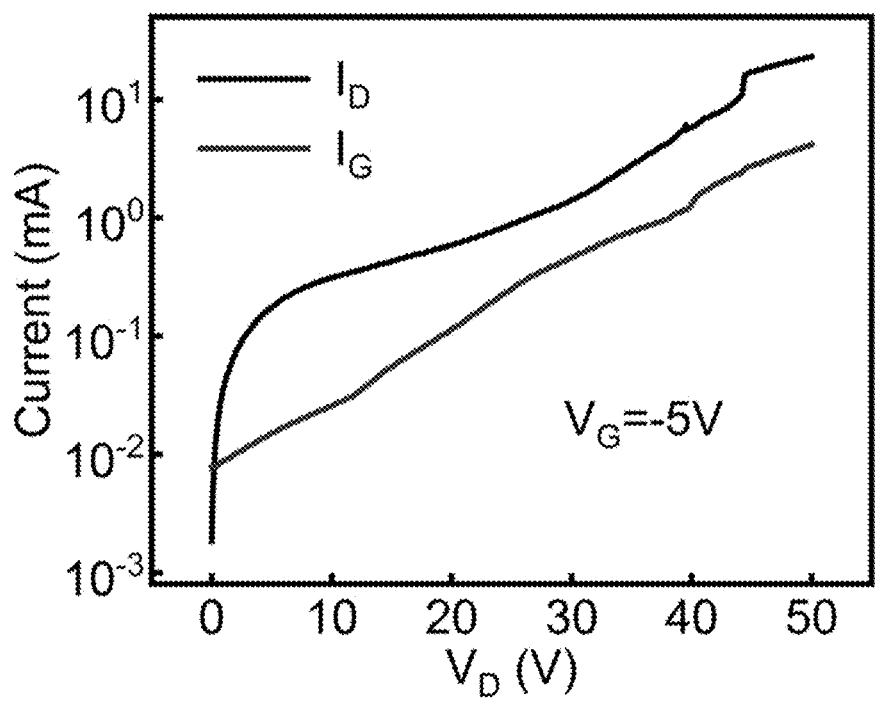
FIG. 6 shows and OFF-state I-V curve of the GaN VC-JFETs.

A typical OFF-state I-V curve of the GaN VC-JFETs is shown in FIG. 6. The drain current and gate current were normalized by effective fin region and gate region, respectively. The gate current was mainly the superposition of leakage current from both lateral and vertical p-n junctions. The drain current consists of leakage current from vertical p-n junctions and the leakage current induced by the weak pinch-off effects of lateral p-n junctions. The drain current is around ten times higher than the gate current, indicating the drain leakage contributed to the main leakage in drain current at off-state. The drain current broke down at 45 V, while no breakdown was observed at the gate. These results suggest that the off-state characteristics of this device are primarily limited by weak pinch-off effects of the lateral p-n junctions.

Figure 7A:
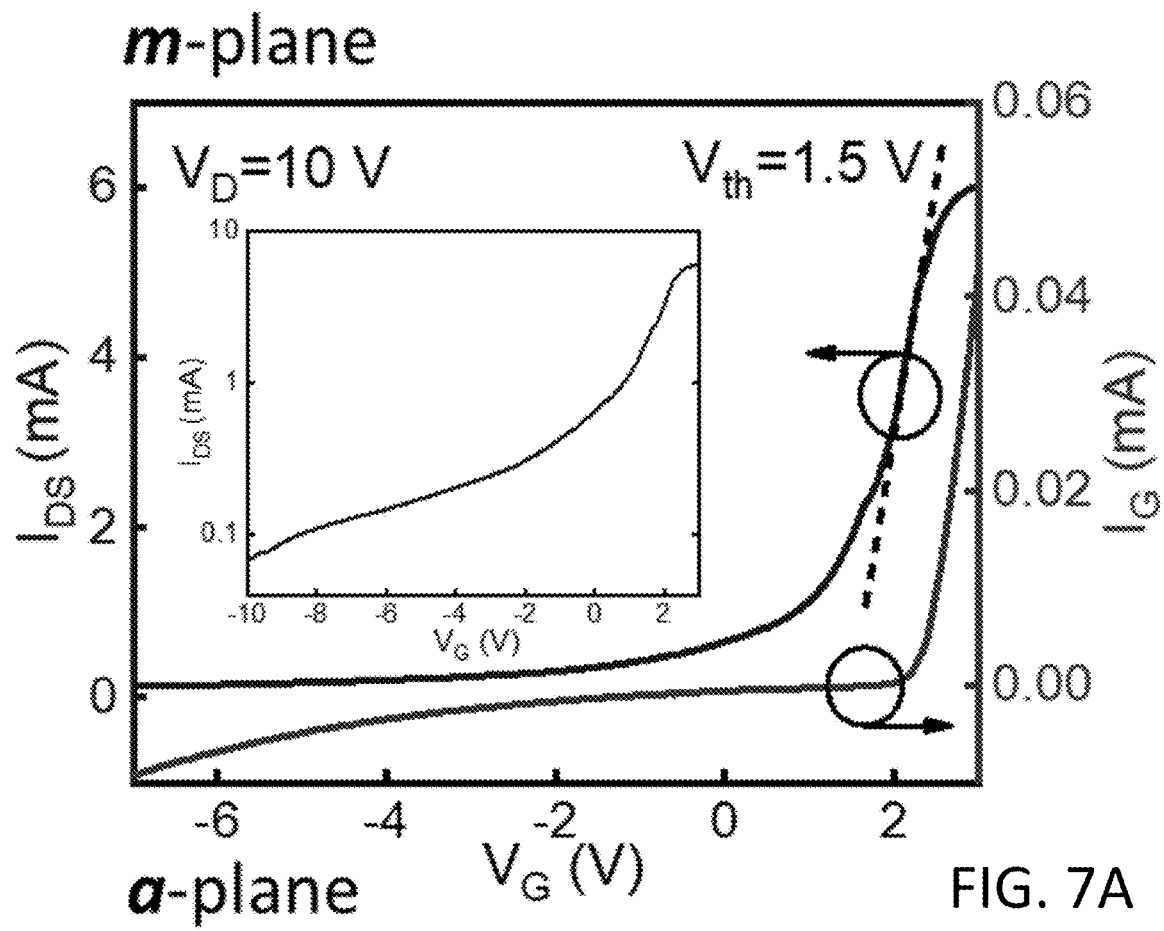
FIGS. 7A and 7B show transfer characteristics of VC-JFETs aligned to m-plane and a-plane, respectively.
Figure 7B:
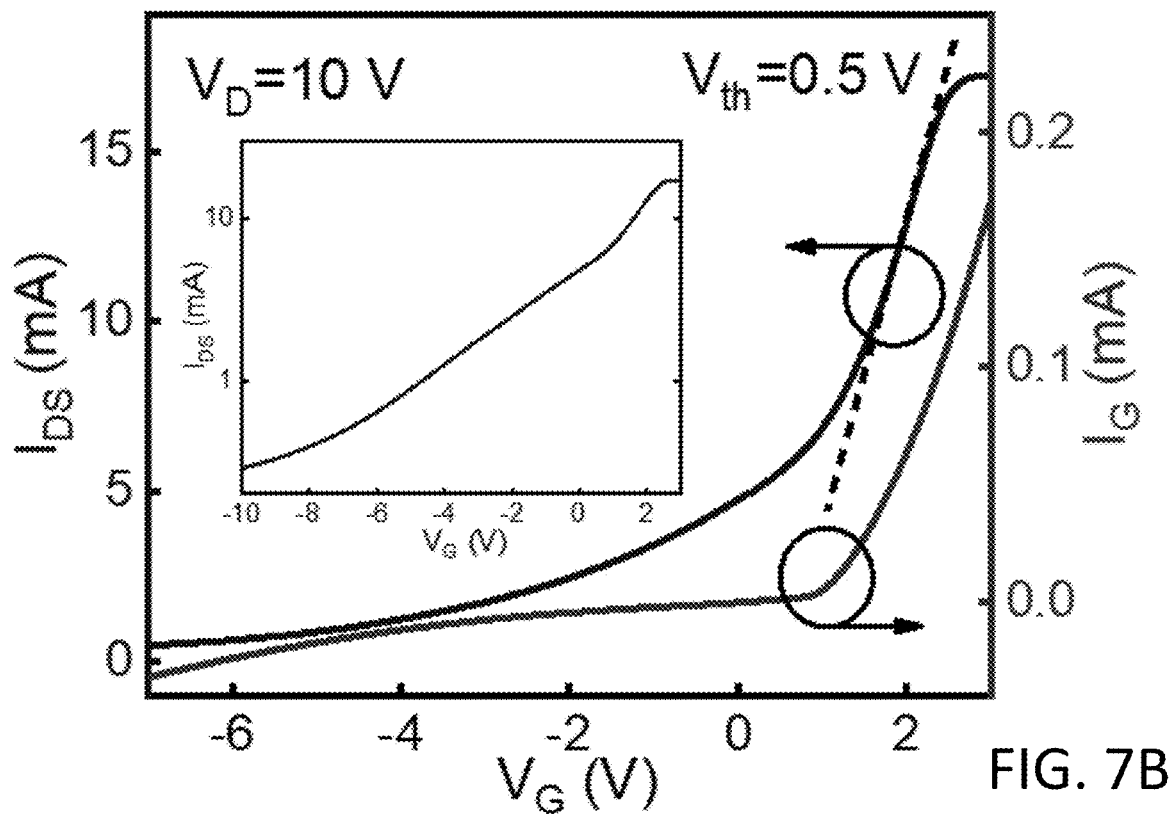

FIGS. 7A and 7B compare the transfer characteristics of the VC-JFETs aligned to m-plane and a-plane, respectively. The peak transconductances are 625 S/cm$^2$ and 916 S/cm$^2$ (normalized by fin areas) in m-plane and a-plane devices, respectively. The threshold voltage ($V_{th}$) voltages are determined by the following method: first the point of maximum transconductance on the $I_D$-$V_{GS}$ curve was found, and the maximum slope was extrapolated to $I_{DS}$=0 to find the x-axis intercept. The m-plane and the a-plane devices showed turn-on voltages at ~1.5 V and ~0.5 V, respectively.

The a-plane device showed higher on-current compared to m-plane. This discrepancy is likely due to non-alloyed source contacts. The UID-GaN was treated with ICP etching to created donor-like surface defects to facilitate drain contacts. Different surface conditions before electrode deposition may lead to non-uniform contact resistance in different devices. The gate leakage in a-plane devices is around ten times higher than that of m-plane devices. This difference in gate leakage is likely related to different crystal orientations. It is possible that the defect and impurity level at m-plane could be lower than a-plane after TMAH treatment, resulting in lower gate leakage.

Interfacial impurities such as silicon (Si) and oxygen (O) have been shown to strongly effect GaN regrown p-n diodes. Using electron holography, the electrostatic potential profile at the regrowth interface was obtained. The energy band diagram showed large band bending at the regrowth interface. This indicates the formation of p$^+$/n$^+$ tunneling junction at the regrowth interface. The n$^+$-GaN is due at least in part to high concentration of Si and O impurities acting as shallow donors, and the p$^+$ doping at the regrowth interface is likely due to Si—Mg and/or O—Mg co-doping effects. The overlapping of Mg and Si/O at the interface region can enhance the hole concentration up to two orders of magnitude. The formation of tunneling junctions at the regrowth interface may be responsible for the large leakage, premature breakdown in regrown p-n junctions, and weak pinch-off effect of the lateral p-n junctions.

Figure 8B:
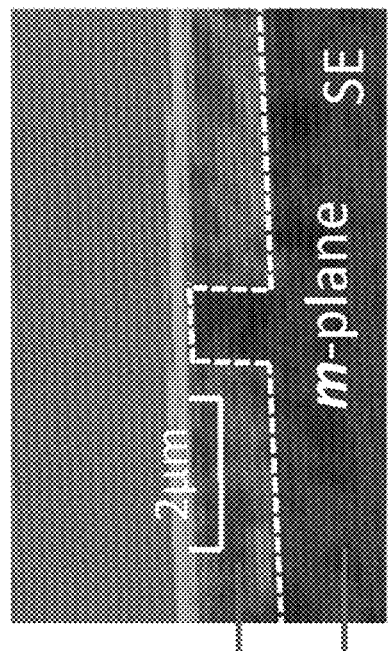
FIGS. 8A and 8B show cross-sectional SEM images of VC-JFETs devices aligned to a-plane and m-plane, respectively.
Figure 8A:
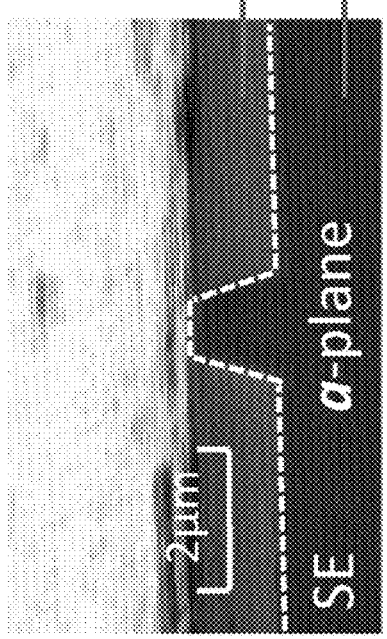
Figure 8D:
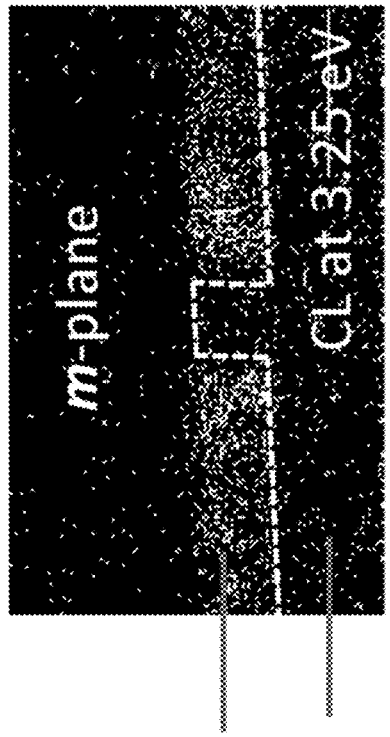
FIGS. 8C and 8D show monochromatic CL images at 3.25 eV for devices aligned a-plane and m-plane, respectively.
Figure 8C:
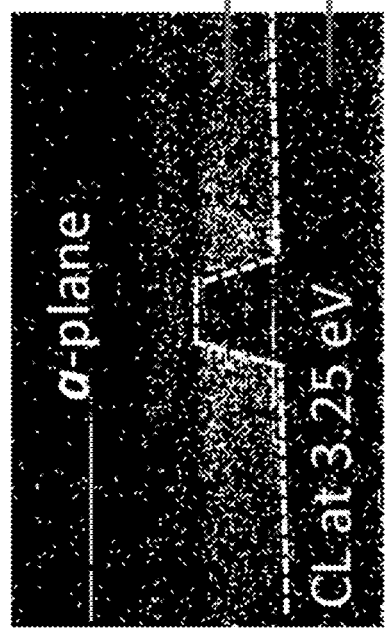
Figures 8E, 8F:
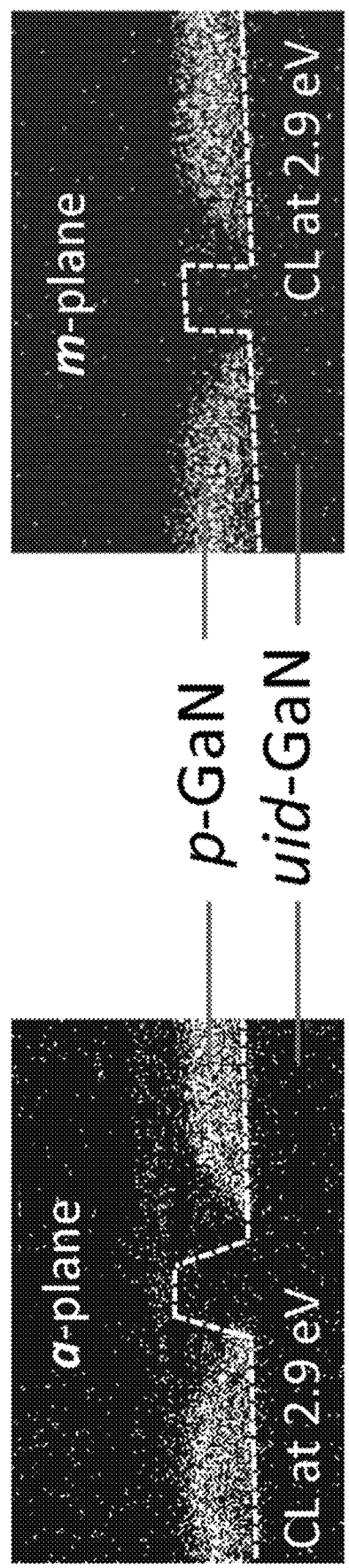
FIGS. 8E and 8F show monochromatic CL images at 2.9 eV for devices aligned to a-plane and m-plane, respectively.

Another factor that may be limiting the device performance is the nonuniform distribution of acceptors in GaN epilayers grown on fin structures. Cathodoluminescence (CL) spectroscopy was used to study the optical properties of p-GaN in VC-JFET devices. The CL was carried out in a JEOL 6300 scanning electron microscope. The electron beam current was 100 pA and the acceleration voltage was 7 kV. CL mappings were obtained by recording the spatial variation of luminescence intensity over an area at a certain wavelength. FIGS. 8A-8F show the secondary electron (SE) images, and CL mappings at 3.25 eV and 2.9 eV of m-plane and a-plane devices. 2.9 eV emission intensity in CL can be used as an indicator for acceptor concentrations. The higher the CL intensity at 2.9 eV, the higher the acceptor concentration. FIGS. 8A and 8B show cross-sectional SEM images of VC-JFETs devices aligned to a-plane and m-plane, respectively. FIGS. 8C and 8D show monochromatic CL images at 3.25 eV for devices aligned a-plane and m-plane, respectively. FIGS. 8E and 8F show monochromatic CL images at 2.9 eV for devices aligned to a-plane and m-plane, respectively. FIGS. 8E and 8F indicate that weaker intensity was observed on the sidewalls of the fins, indicating that the p-GaN grown on the sidewall of the fins had lower acceptor concentration. The interface between acceptor deficient p-GaN and normal p-GaN makes a 45° angle with the basal plane in both m-plane and a-plane devices. This indicates that this phenomenon is not related to crystal orientations, and possibly due to regrowth conditions and/or surface treatment.

All the aforementioned non-ideal factors indicate that devices regrowth with trenches is much more complicated and difficult than regrowth on planar surfaces. Methods should be explored to eliminate impurities on c-plane and non-polar surfaces simultaneously, as non-polar planes have highly different material properties from the polar c-planes such as dangling bond densities, surface states and impurities incorporation. In addition, the regrowth conditions (e.g., temperature, pressure, III/V ratio) also need to be optimized to improve acceptor concentrations at the sidewall.

GaN VC-JFETs were demonstrated through p-GaN regrowth on the patterned fin-like channel regions by MOCVD. A subsequent photoresist self-planarization process was applied to etch away the p-GaN on top of the n-GaN fins. The regrown lateral and vertical p-n junctions were characterized to verify the effectiveness of the regrowth process. The VC-JFETs show an on-off ratio~100 and excellent transconductances. Devices with vertical channels aligned to a-plane and m-plane were also compared. The nonideal factors such as interfacial impurities and non-uniform acceptor distribution were also discussed.

Although this disclosure contains many specific embodiment details, these should not be construed as limitations on the scope of the subject matter or on the scope of what may be claimed, but rather as descriptions of features that may be specific to particular embodiments. Certain features that are described in this disclosure in the context of separate embodiments can also be implemented, in combination, in a single embodiment. Conversely, various features that are described in the context of a single embodiment can also be implemented in multiple embodiments, separately, or in any suitable sub-combination. Moreover, although previously described features may be described as acting in certain combinations and even initially claimed as such, one or more features from a claimed combination can, in some cases, be excised from the combination, and the claimed combination may be directed to a sub-combination or variation of a sub-combination.

Particular embodiments of the subject matter have been described. Other embodiments, alterations, and permutations of the described embodiments are within the scope of the following claims as will be apparent to those skilled in the art. While operations are depicted in the drawings or claims in a particular order, this should not be understood as requiring that such operations be performed in the particular order shown or in sequential order, or that all illustrated operations be performed (some operations may be considered optional), to achieve desirable results.

Accordingly, the previously described example embodiments do not define or constrain this disclosure. Other changes, substitutions, and alterations are also possible without departing from the spirit and scope of this disclosure.

What is claimed is:

1. A vertical-channel junction field-effect transistor comprising:
    a doped GaN layer;
    an unintentionally doped GaN layer on the doped GaN layer;
    a p-GaN regrowth layer on the unintentionally doped GaN layer, wherein portions of the p-GaN regrowth layer are separated by a vertical channel of the unintentionally doped GaN layer;
    gate electrodes in direct contact with the p-GaN regrowth layer; and
    a source electrode in direct contact with and overlapping with the p-GaN regrowth layer and the unintentionally doped GaN layer.

2. The vertical-channel junction field-effect transistor of claim 1, wherein the gate electrodes are separated by the vertical channel of the unintentionally doped GaN layer.

3. The vertical-channel junction field-effect transistor of claim 2, further comprising a source electrode on the vertical channel of the unintentionally doped GaN layer.

4. The vertical-channel junction field-effect transistor of claim 3, further comprising a drain electrode on the doped GaN layer.

5. The vertical-channel junction field-effect transistor of claim 4, wherein a regrowth interface is defined between the p-GaN regrowth layer and the unintentionally doped GaN layer.

6. The vertical-channel junction field-effect transistor of claim 5, wherein the vertical channel of the unintentionally doped GaN layer forms a vertical p-n junction at the regrowth interface between a gate electrode and a drain electrode.

7. The vertical-channel junction field-effect transistor of claim 6, further comprising a lateral p-n junction at the regrowth interface perpendicular to the vertical p-n junction, wherein the lateral p-n junction is between the gate electrode and a source electrode.

8. The vertical-channel junction field-effect transistor of claim 1, wherein the vertical channel is rectangular in shape.

9. The vertical-channel junction field-effect transistor of claim 1, wherein the vertical channel defines 90° angles with respect to the p-GaN regrowth layer.

10. A vertical-channel junction field-effect transistor comprising:
    a doped GaN layer;
    an unintentionally doped GaN layer on the doped GaN layer;
    a p-GaN regrowth layer on the unintentionally doped GaN layer, wherein portions of the p-GaN regrowth layer are separated by a vertical channel of the unintentionally doped GaN layer; and
    a source electrode in direct contact with and overlapping with the unintentionally doped GaN layer and the p-GaN regrowth layer.

11. The vertical-channel junction field-effect transistor of claim 10, wherein a regrowth interface is defined between the p-GaN regrowth layer and the unintentionally doped GaN layer.

12. The vertical-channel junction field-effect transistor of claim 10, wherein the vertical channel of the unintentionally doped GaN layer forms a vertical p-n junction at the regrowth interface between a gate electrode and a drain electrode.

13. The vertical-channel junction field-effect transistor of claim 10, further comprising a lateral p-n junction at the regrowth interface perpendicular to the vertical p-n junction, wherein the lateral p-n junction is between the gate electrode and the source electrode.

14. The vertical-channel junction field-effect transistor of claim 10, wherein the vertical channel is rectangular in shape.

15. The vertical-channel junction field-effect transistor of claim 10, wherein the vertical channel defines 90° angles with respect to the p-GaN regrowth layer.

* * * * *